United States Patent [19]

Craft et al.

[11] Patent Number: 5,675,120
[45] Date of Patent: Oct. 7, 1997

[54] THREADED BULKHEAD AND LOCKING RING ASSEMBLY FOR UNDERWATER CABLE

[75] Inventors: Thomas F. Craft, Union; Timothy A. Sochor, Middletown; Robert E. Servilio, Washington Township, Morris County, all of N.J.

[73] Assignee: Lucent Technologies Inc., Murray Hill, N.J.

[21] Appl. No.: 437,653

[22] Filed: May 9, 1995

[51] Int. Cl.$^6$ .................................................. H05K 5/00
[52] U.S. Cl. ................ 174/52.1; 174/70 S; 174/52.3
[58] Field of Search ........................... 174/52.1, 52.3, 174/52.5, 151, 152 A, 65 SS, 17 R, 50.5, 50.51, 70 S

[56] References Cited

U.S. PATENT DOCUMENTS 4,767,173  8/1988  Priaroggia ........................ 350/96.2
5,301,959  4/1994  Gould ................................ 277/184
5,400,298  3/1995  Hepp ................................. 367/20

Primary Examiner—Kristine L. Kincaid
Assistant Examiner—Kristina Soderquist

[57] ABSTRACT

An enclosure for electronic circuits intended to operate at great depths beneath the sea in which the circuits are protected from stresses induced by the accumulation of mechanical tolerances during assembly, from shock during transportation, and from deformation of the enclosure at great pressure. The circuits being accessible in their final configuration during testing before insertion into the enclosure and sealing. Cable lengths within the enclosure are minimized to ensure reliability.

27 Claims, 4 Drawing Sheets

THREADED BULKHEAD AND LOCKING RING ASSEMBLY FOR UNDERWATER CABLE

BACKGROUND OF THE INVENTION

1. Field of the Invention

This invention relates to a pressure vessel enclosure for electronic packages intended to operate at great depths in the sea and to a method of its assembly.

2. Description of Related Art

As communications services proliferate, there is a need for increased capacity and bandwidth between the continents. Undersea cables have contributed to the needed capacity and fiber optics technology has enlarged the bandwidth of communications channels within each undersea system. Undersea cables also provide the minimum delay time for signal propagation between the continents, which is important for two-way conversations.

The installation of each undersea system represents a great financial investment, so reliable operation over many decades must be ensured. Electronic or optical signals must be amplified several times to span an ocean. Electronic assemblies are therefore tested at several stages during assembly and, most importantly, just before the equipment package is permanently sealed to withstand depths of 18,000 feet and pressures of 10,000 pounds per square inch.

Fully operational undersea communications systems are comprised of electronics housed within individual pressure-withstanding vessels capable of surviving full ocean depths for many years. These containers are very robust, heavy, and expensive. Moreover, connections to the electronics within, must penetrate the housings through specially-designed high pressure seals to protect the components from the corrosive effects of the ocean.

The pressure vessels are cylindrically shaped with ends capped by circular bulkheads which contain the pressure seals. The connections to/from the undersea circuits are brought to the outside of the individual pressure vessels via the water-tight seals and are spliced to the main cable joining the other circuit elements.

These pressure housings contain amplifying repeaters and are spaced along the cable between the shore based terminations. In traditional designs the electronics are mounted to a separate structure and assembled into an open-ended cylinder, the pressure housing. The circular bulkheads, which contain the water-tight seals and feed-throughs, are used to cap the ends of the cylinder in a welding operation. To prevent the electronics structure from rotating or moving within the cylinder, another cylindrical sleeve is interposed between the electronics and the pressure vessel. The sleeve is designed to have an outer diameter that mechanically interferes with the inner diameter of the pressure vessel.

The assembly method requires that the pressure vessel be heated and expanded. The sleeve is then inserted into the pressure vessel and the pressure vessel is allowed to cool and secure the sleeve. The electronics Structure is then inserted and fastened to the inside surfaces of the sleeve with a variety of fastening mechanisms. The bulkheads are then brought close to the pressure vessel to allow the final splices to be made between the feed-throughs and the interior electronics.

Manually splicing and immobilizing the cables and splices is an arduous operation especially when working small diameter enclosures. Also, folding and fastening the cables and splices into the interior of the vessel is awkward and requires skill. Moreover, inspection of the interior becomes increasingly difficult as the vessel is closed. This limited access can lead to damaged connections particularly when working with fiber optic cable. To facilitate repair, extra fiber optic cable is stored in cable trays attached to the bulkhead. If damage occurs, extra cable is pulled from the trays and a new splice is made. Obviously, the number of new splices is limited.

Accordingly, there is a need for an underwater cable electronics enclosure which eliminates the assembly and testing difficulties described above. These enclosures should:

Improve reliability for 25 year service,

Permit open electrical testing through the pressure seals before final closure,

Reduce assembly time and cost,

Facilitate inspection,

Reduce hardware count and complexity, and

Eliminate excessive cable lengths.

Additionally, the enclosure should protect the electronic components from mechanical shock in cable reeling and cable laying operations and from distortions to the package due to great pressure changes. Similarly, a design which is insensitive to the accumulation of mechanical tolerances in the various elements of the structure would ease assembly and reduce mechanical stress in operation.

SUMMARY OF THE INVENTION

The present invention relates to an undersea cable pressure vessel design and method of assembly which permits the open testing of electronic components and sub-assemblies and easy assembly before the pressure vessel and bulkhead are welded shut.

In one embodiment of the invention, one or more bulkheads support card trays containing electronic or optical components. The bulkhead is formed to fit within the pressure vessel which terminates in at least one seat. The bulkhead and card trays are inserted into the pressure vessel and a lock ring having an inner thread engages external threads on the bulkhead so that the inner surface of the lock ring also contacts the seat of the pressure vessel. Compliant means may be inserted between the bulkhead and the card trays to absorb shock, the accumulation of tolerances, or the compression of the enclosure at extreme depths in the sea. The compliant means may be a rubber-like gasket, or a coil, leaf, or disk spring. After final assembly, the pressure vessel and lock ring are welded together to form an enclosed, pressure proof volume.

In another embodiment of the invention, card trays which support electronic or optical circuits are mounted to an end plate which is spring loaded to a bulkhead. The spring loading protects the card trays from stresses which would be caused by the accumulation of mechanical tolerances in fabrication and assembly, from shock in handling the pressure vessel, and from the distortion of the pressure vessel at great depths in the sea. The spring loading may be achieved by one or more leaf, coil, or disk type springs. After testing, the end plate and card tray assembly is inserted into the pressure vessel a lock ring engages threads on the bulkhead until the lock ring touches the pressure vessel. The bulkhead, lock ring, and pressure vessel are then welded together to form an enclosed volume which protects the circuits.

In yet another embodiment of the invention, a clearance hole is formed into the end plate described above and a shoulder screw is inserted through the end plate so that its head contacts the same side of the end plate as the card tray(s). The threaded portion of the screw engages threads which have been cut into the bulkhead. A coil spring surrounds each shoulder screw and keeps the end plate and bulkhead separated from each other.

In a still another embodiment of the invention, identical end plates and bulkheads are separated by springs on each end of the pressure vessel. The end plates support the card trays and their associated circuits as before.

In each of the embodiments, the springs which separate the end plates from the bulkhead may be either coil, leaf, or disk type springs, or any combination of these.

The present invention also relates to a method of testing and assembling the invention. After the circuit components are mounted and interconnected to the card tray(s) and each card tray is mounted to an end plate, cable connections are made to circuit components. These components may be for power, electrical signals, or optical signals. All the components are then tested to meet system specifications with test points open to a technician for probing. The card trays and end plate are then inserted into the pressure vessel which is then sealed with a bulkhead or a bulkhead plus lock ring assembly. The tests may be repeated and then the enclosure is welded shut.

The advantages provided by the invention include the ability to absorb accumulation of mechanical tolerances over the length of the enclosure, the ability to absorb shock in transit, the ability to absorb compression of the enclosure in the depths of the seas, and the ability to perform qualification testing and inspection of the completely assembled communications package outside the enclosure without the problems of folding excessive cable lengths during assembly.

These and other features and advantages of the invention will be better understood with consideration of the following detailed description of the preferred embodiments taken in conjunction with the accompanying drawings.

The drawings are not to scale.

DETAILED DESCRIPTION OF THE PREFERRED EMBODIMENTS

Figure 1:
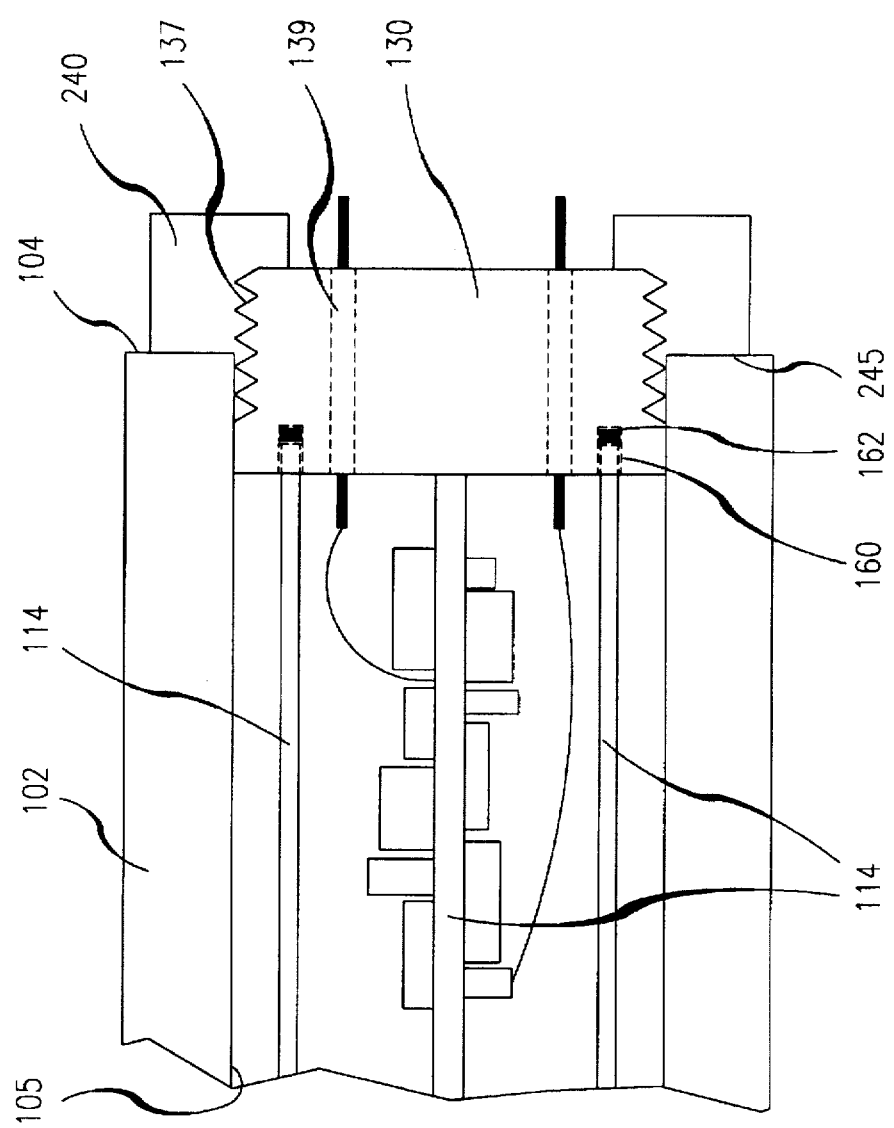
FIG. 1 is a partial side assembly drawing of one embodiment of the invention.

Referring now to FIG. 1, there is shown apparatus 100 which is in accordance with one embodiment of the invention. Pressure vessel 102 has an inner surface 105 and a seat 104 on each end of it. Bulkhead 130 is sized to fit within inner surface 105 and is also adapted to support card trays 114 which, in turn, support electronic and optical components. The card trays are held in place by support 160 which may be a blind aperture machined into the bulkhead or a simple bracket mounted to it. Compliant means 162 are interspersed between the end of each card tray and support 160. The compliant means may be a rubber-like gasket or a coil, leaf, or disk-type spring. This arrangement absorbs the accumulation of mechanical tolerances in assembly and also the compression of the pressure vessel at great depths, thereby protecting the electrical and optical components from mechanical stress. Bulkhead 130 contains penetrations 139 which connect exterior cables to the electronic and optical components. Threads 137 on the bulkhead are adapted to fit similar threads in lock ring 240. When the bulkhead and card tray assembly is inserted into the pressure vessel, lock ring 240 is tightened upon threads 137 until inner surface 245 on the lock ring contacts seat 104 on the pressure vessel. Another round of testing may then be performed. The lock ring may then be welded to the pressure vessel.

Figure 2:
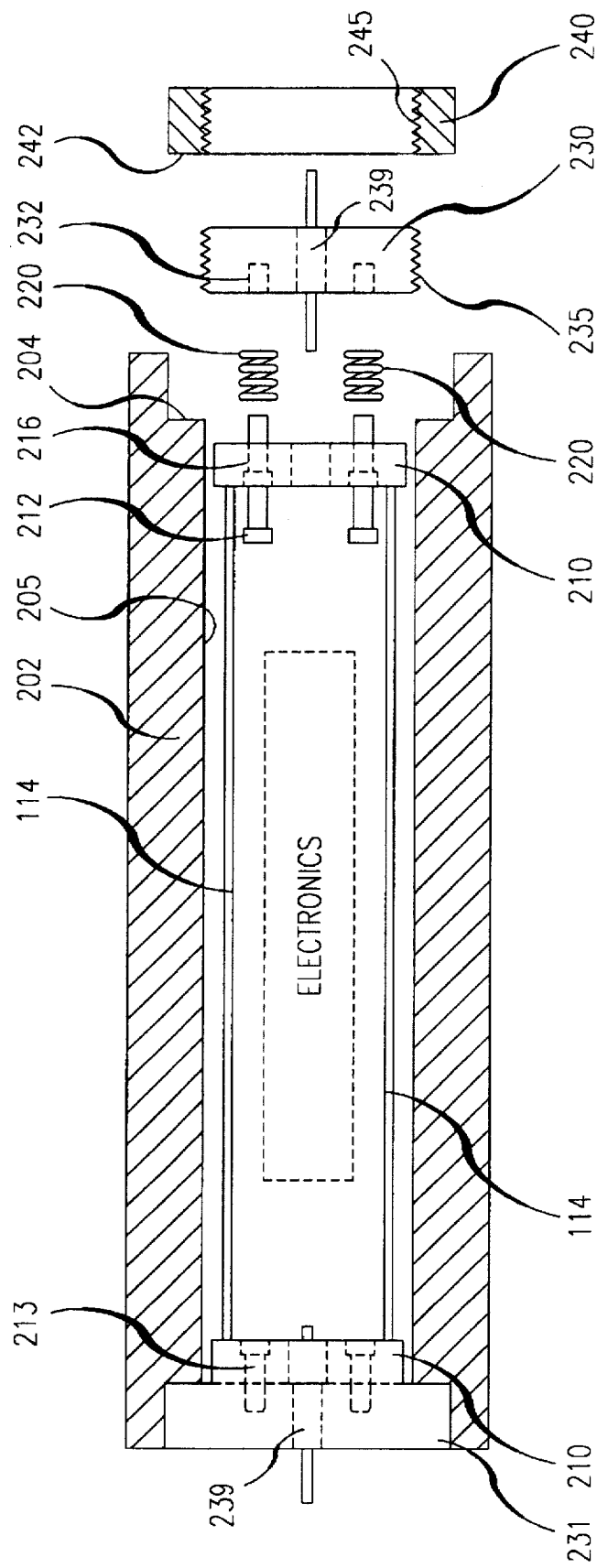
FIG. 2 is a side sectional assembly drawing of another embodiment of the invention.

Referring now to FIG. 2, there is shown apparatus 200 which is in accordance with another embodiment of the invention intended to protect electronic and optical components from hostile environments. Seat 204 is machined into pressure vessel 202 which is symmetrical on both ends. Card trays 114 support optical and electronic components and are supported on each end by end plate 210. One end plate is mounted with screws 213 directly to bulkhead 231 which is sized to fit against seat 204 on one side of the pressure vessel. Bulkhead 231 has a penetration 239 which connects the interior circuits to the external cable. The other end plate contains clearance holes 216 to permit shoulder screws 212 to pass from the card tray area through the end plate and toward bulkhead 230 which contains blind tapped holes 232 to receive the threaded portions of each shoulder screw. Coil spring 220 surrounds each shoulder screw and is compressed partially in the assembly operation when the shoulder screws are turned into the blind tapped holes in the bulkhead.

Bulkhead 230 also has threads 235 which are adapted to mate with threads 245 of lock ring 240. The bulkhead is tightened against coil spring 220 and electrical testing is done on an open benchtop with the electrical components on the card trays exposed for probing. The bulkhead and end plate assembly which supports the card trays is then inserted into the pressure vessel. Lock ring 240 is turned with a spanner wrench to engage threads 235 on the bulkhead and threads 245 on the lock ring, respectively, until seat 204 contacts inner surface 242. When testing is complete, the lock ring is electron beam welded to the pressure vessel and bulkhead 230.

Figure 3:
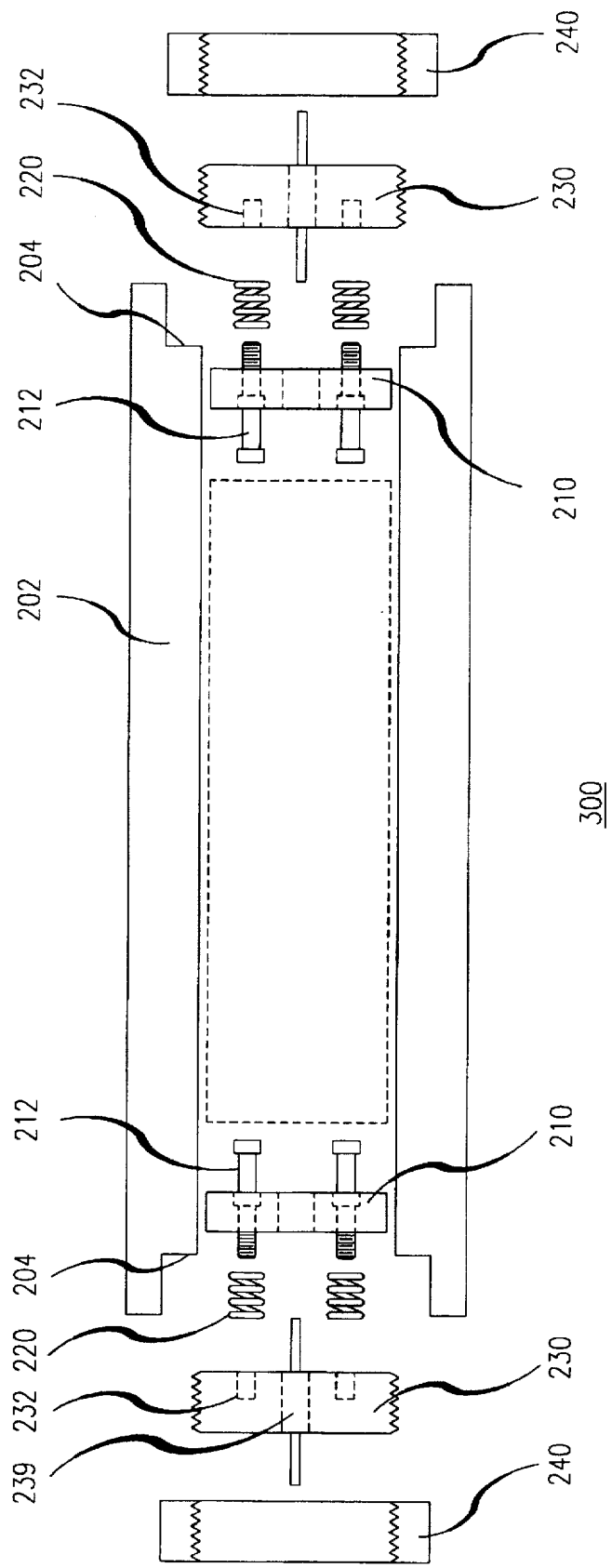
FIG. 3 is a side sectional assembly drawing of yet another embodiment of the invention.

Referring now to FIG. 3, there is shown apparatus 300 in accordance with another embodiment of the same invention. Elements which are the same as those described in FIG. 2 are identified by the same reference numbers. The difference in the figures being that the end plates 210 on each end of apparatus 300 are spring loaded to the bulkheads 230. The end plates in turn support card trays (not shown) containing electronic and optical components which occupy the dotted rectangle.

Figure 4:
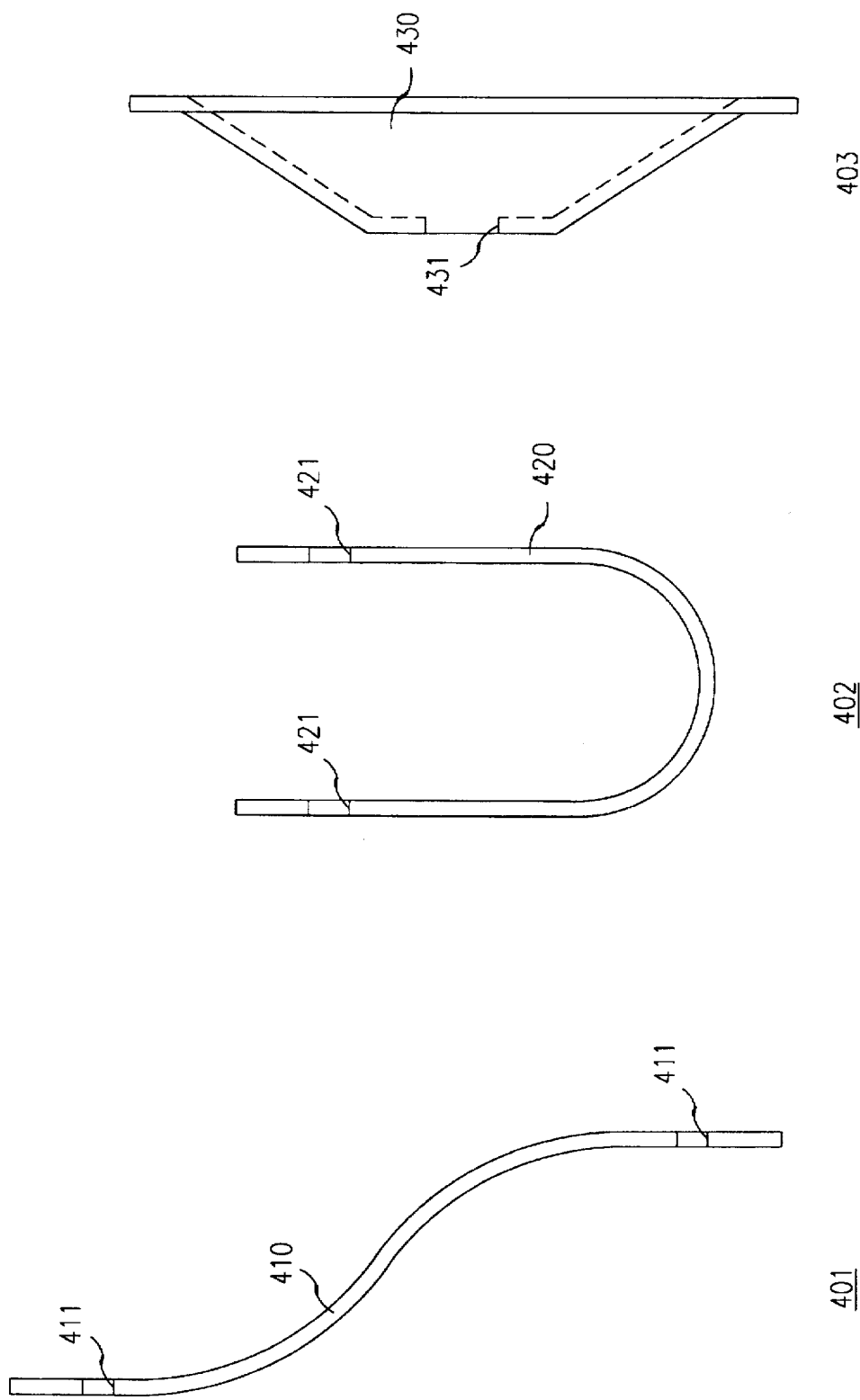
FIG. 4 is a side view of possible additional spring configurations.

Referring now to FIG. 4, there are shown alternative spring configurations 401, 402, and 403 which perform the same function, in the same way, to achieve the same result as the coil spring previously described. These springs may be any form of leaf spring 410, a U-shaped spring 420, or a disk-type spring 430. Apertures 411, 421, or 431 may be defined by springs 410, 420, or 430, respectively. Any of the springs may be penetrated by shoulder screw 212 or they may be fastened to either end plate 210 or bulkheads 130, 230, or 330, which were previously described. The fastening may be achieved by clips, screws, rivets, an adhesive bond, or a weld, which are all well known in the art.

In a preferred embodiment, the pressure vessel is made of beryllium-copper alloy and is 18 inches long and 4.5 inches in diameter. The shoulder screws are three inches long having a 10–24 UNC-2B thread. The lock ring and bulkhead are made from beryllium-copper alloy having a 4.375-8 UN-2A thread. The coil springs are 0.5 inches in diameter, 3.25 inches long, having 0.062 inch wire thickness and they are compressed about 0.5 inch during assembly. When the electrical tests are complete, the lock ring is welded to the pressure vessel using an electron beam.

A further embodiment of the invention comprises a method of assembling and testing an enclosure for electronic circuits wherein the circuit components are mounted to a card tray to interconnect them, the card tray is secured to an end plate, communications cables are connected to the card tray to provide access to a system, the circuit components on the card tray are tested to ensure specified operation, the card tray and end plate assembly are inserted into a pressure vessel which is sealed with a bulkhead and lock ring, and the lock ring is welded to the pressure vessel to ensure protection of the circuits.

Features of the invention are that the coil springs cooperate with the end plate and the bulkhead to absorb mechanical tolerance additions in the card tray assembly, to absorb shock in handling the pressure vessel aboard ship, and to absorb movement of the bulkhead toward the card trays as the outside pressure increases.

An important advantage is that the card trays, end plate, and bulkhead are assembled and tested outside the pressure vessel to permit probing of individual sections of the circuits before the pressure vessel is sealed. This tested assembly is capable of sliding into the pressure vessel without the need to fold cables into restricting trays which are common in earlier designs. An assembler would not be able to guide cables into a 4.5 inch interior which is already filled with components.

Changes and modifications in the specifically described embodiments can be carried out without departing from the scope of the invention. In particular, any of the springs of FIG. 4 may be used with apparatus 200 or 300 and attachment of the springs to the end plate or bulkhead may obviate the need for the shoulder screws. The bulkhead and locking ring may have various configurations which cooperate to seal the pressure vessel. A shrink fit between the lock ring and bulkhead would be sufficient to hold them together for a welding operation. Springs may also be interspersed between the bulkhead and card tray in apparatus 100.

We claim:

1. An enclosure for holding at least one card tray which supports electronic circuits comprising:
   a pressure vessel having an inner surface and at least one seat;
   a bulkhead fitting within the inner surface of the pressure vessel having external threads;
   the bulkhead having at least one support for holding the at least one card tray;
   the bulkhead further having at least one penetration which permits communications between the electronic circuits and an external system; and
   a lock ring having inner threads, being adapted to mate with the external threads of the bulkhead and to contact the seat of the pressure vessel;
   wherein prior to insertion of the bulkhead within the pressure vessel, the card tray and the electronic circuits are connectable for communications with the external system and the at least one card tray is connectable to the bulkhead.

2. The enclosure of claim 1 wherein the pressure vessel is a cylindrical annulus having an inner diameter and an outer diameter.

3. The enclosure of claim 1 further comprising compliant means interspersed between the bulkhead and the at least one card tray.

4. The enclosure of claim 3 wherein the compliant means is a rubber gasket.

5. The enclosure of claim 3 wherein the compliant means is a spring.

6. The enclosure of claim 1 wherein the pressure vessel, the lock ring, and the bulkhead are welded together.

7. An enclosure for holding at least one card tray which supports underwater electronic circuits comprising:
   a cylindrical pressure vessel, having an inner surface and a seat on each end, which surrounds the circuits;
   a first end plate, having at least one hole, being adapted to support said at least one card tray which supports the underwater electronic circuits;
   a first bulkhead, having a penetration for permitting communications between an external system and the electronic circuits, being adapted to mate with the seat on a first end of the pressure vessel, and having at least one blind tapped hole;
   a first screw adapted to mount the first end plate to the first bulkhead at the blind tapped hole;
   a second end plate being adapted to support said at least one card tray which supports the underwater electronic circuits;
   a second bulkhead, having external threads and a penetration for permitting communications between the external system and the electronic circuits, being adapted to fit within the inner surface of the pressure vessel;
   a spring adapted to fit between the second bulkhead and the second end plate so as to keep them separated; and
   a lock ring adapted to contact the seat located at a second end of the pressure vessel, having internal threads which mate with threads on the second bulkhead, wherein prior to insertion into the pressure vessel, the at least one card tray and the electronic circuits are connectable for communications with the external system.

8. The enclosure of claim 7 further comprising a clearance hole in the second end plate.

9. The enclosure of claim 7 further comprising a blind tapped hole in the second bulkhead.

10. The enclosure of claim 9 further comprising a second screw, having a head, a shank, and a threaded portion, which penetrates the second end plate and engages the tapped hole of the second bulkhead.

11. The enclosure of claim 7 wherein the second bulkhead, lock ring, and pressure vessel are welded together.

12. The enclosure of claim 7 wherein the second end plate fits within the inner surface of the pressure vessel.

13. The enclosure of claim 7 wherein the spring is a coil spring.

14. The enclosure of claim 7 wherein the spring is a leaf spring.

15. The enclosure of claim 7 wherein the spring is a disk spring.

16. An enclosure for holding at least one card tray which supports underwater electronic circuits comprising:
   a cylindrical pressure vessel, having an inner surface and a seat on each end, which surrounds the circuits;
   a first end plate, having at least one hole, for supporting the at least one card tray which supports the underwater electronic circuits;

a first bulkhead, having a penetration for permitting communications between an external system and the electronic circuits, being adapted to mate with the seat on a first end of the pressure vessel, and having at least one blind tapped hole;

a first screw adapted to mount the first end plate to the first bulkhead at the blind tapped hole;

a second end plate, having at least one clearance hole, for supporting the at least one card tray which supports the underwater electronic circuits;

a second bulkhead, having external threads and a penetration for permitting communications between said external system and the electronic circuits, being adapted to fit within the inner surface of the pressure vessel and having a blind tapped hole;

a spring adapted to fit between the second bulkhead and the second end plate so as to keep them separated;

a lock ring adapted to contact one of the seats on the pressure vessel, having internal threads which mate with threads on the second bulkhead; and a second screw, having a head, a shank, and a threaded portion, which penetrates the second end plate and engages the tapped hole of the second bulkhead, wherein prior to insertion into the pressure vessel, the at least one card tray and the electronic circuits are connectable for communications with the external system.

17. The enclosure of claim 16 wherein the spring is a coil spring.

18. The enclosure of claim 16 wherein the spring is a leaf spring.

19. The enclosure of claim 16 wherein the spring is a disk spring.

20. An enclosure for holding at least one card tray which supports underwater electronic circuits comprising:

a cylindrical pressure vessel, having an inner surface and a seat on each end, which surrounds the circuits;

two end plates, each a at least one hole, for supporting the at least one card tray which supports the underwater electronic circuits and to fit inside the pressure vessel;

two bulkheads, each having a penetration for permitting communications between an external system and the electronic circuits, being adapted to mate with the seats on the pressure vessel, each having at least one blind tapped hole;

a spring adapted to fit between each of said bulkheads and end plates so as to keep them separated; and two lock rings adapted to contact one of the seats on the pressure vessel, having internal threads which mate with threads on the two bulkheads, wherein prior to insertion into the pressure vessel, the at least one card tray and the electronic circuits are connectable for communications with the external system.

21. The enclosure of claim 20 further comprising a clearance hole in each of said end plates.

22. The enclosure of claim 20 further comprising a tapped hole defined by each bulkhead.

23. The enclosure of claim 20 further comprising a screw, having a head, a shank, and a threaded portion, which penetrates an end plate and engages the tapped hole of one of the two bulkheads.

24. The enclosure of claim 20 wherein the bulkheads, lock rings, and pressure vessel are welded together.

25. The enclosure of claim 20 wherein the spring is a coil spring.

26. The enclosure of claim 20 wherein the spring is a leaf spring.

27. The enclosure of claim 20 wherein the spring is a disk spring.

* * * * *